United States Patent
Park et al.

(10) Patent No.: US 8,227,919 B2
(45) Date of Patent: Jul. 24, 2012

(54) INTERCONNECTION STRUCTURE AND ELECTRONIC DEVICE EMPLOYING THE SAME

(75) Inventors: Han-Byung Park, Seongnam-si (KR); Soon-Moon Jung, Seongnam-si (KR); Hoon Lim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 147 days.

(21) Appl. No.: 12/458,391

(22) Filed: Jul. 10, 2009

(65) Prior Publication Data
US 2010/0006942 A1 Jan. 14, 2010

(30) Foreign Application Priority Data
Jul. 11, 2008 (KR) .................. 10-2008-0067795

(51) Int. Cl.
*H01L 27/12* (2006.01)

(52) U.S. Cl. ..................... 257/750; 257/758

(58) Field of Classification Search .......... 257/750, 257/758
See application file for complete search history.

(56) References Cited

U.S. PATENT DOCUMENTS

| | | | | |
|---|---|---|---|---|
| 5,691,572 A | * | 11/1997 | Chung | 257/751 |
| 5,798,299 A | * | 8/1998 | Chung | 438/625 |
| 5,976,971 A | * | 11/1999 | Kinpara et al. | 438/637 |
| 6,303,879 B1 | * | 10/2001 | Burkhart | 174/261 |
| 6,545,360 B1 | * | 4/2003 | Ohkubo et al. | 257/758 |
| 7,423,898 B2 | * | 9/2008 | Tanizaki et al. | 365/148 |
| 7,544,992 B2 | * | 6/2009 | Shih et al. | 257/323 |
| 7,759,184 B2 | * | 7/2010 | Lotfi et al. | 438/199 |
| 7,765,686 B2 | * | 8/2010 | Murakami et al. | 29/831 |
| 7,897,428 B2 | * | 3/2011 | Assefa et al. | 438/98 |
| 2002/0066957 A1 | * | 6/2002 | Maex et al. | 257/751 |
| 2002/0075719 A1 | * | 6/2002 | Johnson et al. | 365/130 |
| 2006/0028861 A1 | * | 2/2006 | Han et al. | 365/154 |
| 2007/0205450 A1 | | 9/2007 | Okita | |
| 2008/0316798 A1 | * | 12/2008 | Tanizaki et al. | 365/148 |

FOREIGN PATENT DOCUMENTS

| | | |
|---|---|---|
| JP | 2005-072171 A | 3/2005 |
| KR | 10-2006-0015386 A | 2/2006 |
| KR | 10-2007-0065356 A | 6/2007 |

* cited by examiner

*Primary Examiner* — Eugene Lee
(74) *Attorney, Agent, or Firm* — Lee & Morse, P.C.

(57) ABSTRACT

An interconnection structure and an electronic device employing the same are provided. The interconnection structure for an integrated structure includes first and second contact plugs disposed on a substrate, and a connection pattern interposed between sidewalls of the first and second contact plugs and configured to electrically connect the first and second contact plugs.

17 Claims, 9 Drawing Sheets

INTERCONNECTION STRUCTURE AND ELECTRONIC DEVICE EMPLOYING THE SAME

BACKGROUND

1. Field

Embodiments relate to an interconnection structure and an electronic device employing the same and, more particularly, to an interconnection structure for an integrated circuit (IC) and an electronic device employing the same.

2. Description of the Related Art

In general, a semiconductor device may include a plurality of bulk transistors arranged two-dimensionally on a substrate. The bulk transistors may be scaled down to increase an integration density of the semiconductor device. With developments of photolithography processes and exposure equipment used therefore, a size of the bulk transistors may have somewhat scaled down. Despite the reduction in the size of the bulk transistors, however, there may be a specific technical limit to increasing the integration density of the semiconductor device including the two-dimensionally arranged bulk transistors.

Furthermore, to configure an integrated circuit (IC), discrete devices, e.g., transistors, may be electrically connected using interconnections. With an increase in the integration density of the semiconductor devices, the discrete devices may be downscaled and a width of the interconnections and an interval therebetween may be gradually decreased.

Reductions in the width of the conductive interconnections and the interval therebetween may lead to not only an increase in the electrical resistance of the interconnections but also to an increase in parasitic capacitance between the interconnections. Therefore, the increases in the electrical resistance and parasitic capacitance of the interconnections may result in a reduction of the transmission rate of electrical signals applied to the interconnections.

SUMMARY

Embodiments are therefore directed to an interconnection structure and electronic device employing the same, which substantially overcome one or more of the problems due to the limitations and disadvantages of the related art.

It is therefore a feature of an embodiment to provide an interconnection structure that can minimize electrical resistance of the interconnections and parasitic capacitance between the interconnections.

It is therefore another feature of an embodiment to provide an electronic device employing an interconnection structure that can highly integrate an interconnection structure without reducing the operating speed of a semiconductor device.

At least one of the above and other features and advantages may be realized by providing an interconnection structure including first and second contact plugs disposed on a substrate, a connection pattern interposed between sidewalls of the first and second contact plugs and configured to electrically connect the first and second contact plugs.

The connection pattern may include a plurality of patterns spaced apart from each other. In this case, each of the patterns may be electrically connected to the first and second contact plugs.

The patterns spaced apart from each other may be arranged vertically or horizontally and have end portions that are in contact with the sidewalls of the first and second contact plugs.

Intermediate contact plugs may be disposed between the first and second contact plugs to penetrate or separate the connection pattern between the first and second contact plugs and may be electrically connected to the upper connection pattern.

At least one of the above and other features and advantages may also be realized by providing an electronic device that includes first and second elements disposed on a first circuit region of a substrate, a first contact plug electrically connected to the first element, a second contact plug electrically connected to the second element, and an upper connection pattern interposed between sidewalls of the first and second contact plugs and configured to electrically connect the first and second contact plugs.

The upper connection pattern may be disposed at a higher level than at least one of the first and second elements.

The upper connection pattern may include a plurality of connection patterns spaced apart from each other, wherein each of the connection patterns may be electrically connected to the first and second contact plugs.

At least one of the connection patterns may include at least one of a doped single crystalline semiconductor layer, a doped polycrystalline semiconductor layer, a metal silicide layer, and a metal layer.

At least two of the connection patterns may be disposed at different levels.

At least two of the connection patterns may be disposed at the same level.

A lower connection pattern may be disposed at a lower level than the upper connection pattern and may have a portion disposed at the same level as a portion of at least one of the first and second elements.

The first and second contact plugs may partially cover a top surface of the upper connection pattern.

The electronic device may further include a second circuit region of the substrate, and a plurality of elements stacked on the second circuit region of the substrate.

The plurality of element stacked on the second circuit region of the substrate may include a bulk transistor disposed on the second circuit region of the substrate, a lower thin film transistor (TFT) disposed at a higher level than the bulk transistor, and an upper TFT disposed at a higher level than the lower TFT.

The lower TFT may include a lower body pattern disposed at a higher level than the bulk transistor, a lower source region and a lower drain region disposed in the lower body pattern, and a lower gate electrode disposed on the lower body pattern between the lower source and drain regions. The upper TFT may include an upper body pattern disposed at a higher level than the lower TFT, an upper source region and an upper drain region disposed in the upper body pattern, and an upper gate electrode disposed on the upper body pattern between the upper source and drain regions.

The upper connection pattern may be a single layer disposed at the same level as one of the lower body pattern, the lower gate electrode, the upper body pattern, and the upper gate electrode. Alternatively, the upper connection pattern may be multiple layers spaced apart from each other and disposed at the same level as at least two of the lower body pattern, the lower gate electrode, the upper body pattern, and the upper gate electrode.

The first circuit region may be a peripheral circuit region of a semiconductor memory device, and the second circuit region may be a cell array region of the semiconductor memory device.

First upper interconnections may be disposed at a higher level than the first and second contact plugs on the first circuit region of the substrate, and may be spaced apart from the first and second contact plugs.

The electronic device may further include a subsidiary pattern disposed at the same level with at least a portion of the upper connection pattern and electrically connected to at least one of the upper connection pattern and the first and second contact plugs, a conductive subsidiary plug disposed on the subsidiary pattern, and a second upper interconnection disposed on the subsidiary plug, wherein the second upper interconnection may be spaced apart from the first upper interconnections.

The electronic device may further include an intermediate contact plug configured to penetrate or separate the upper connection pattern between the first and second contact plugs and may be electrically connected to the upper connection pattern.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
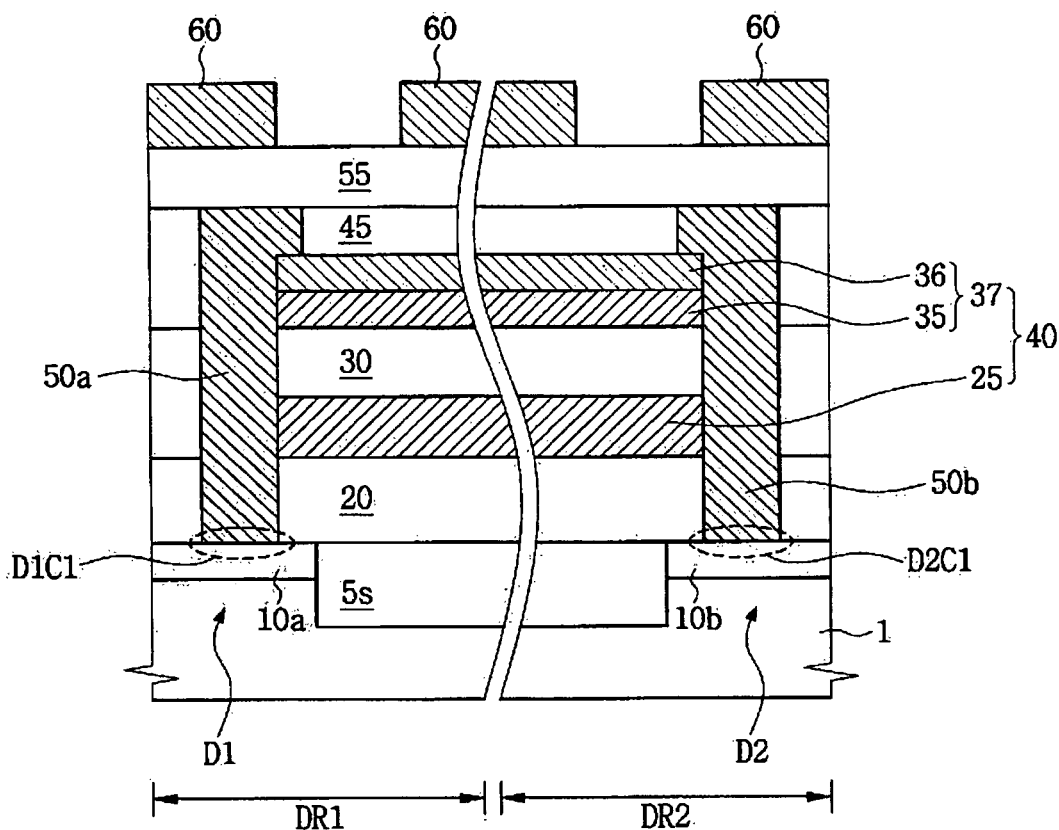
FIG. 1 illustrates a cross-sectional view of an electronic device according to example embodiments.

Korean Patent Application No. 10-2008-0067795, filed on Jul. 11, 2008, in the Korean Intellectual Property Office, and entitled: "Interconnection Structure and Electronic Device Employing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a cross-sectional view of an electronic device according to example embodiments.

Referring to FIG. 1, a substrate 1 may include a first device region DR1 and a second device region DR2, which constitute an integrated circuit (IC). The substrate 1 may be a substrate required for forming a semiconductor IC. For example, the substrate 1 may be a silicon wafer or a silicon-on-insulator (SOI) wafer.

A device isolation region 5s may be provided in a predetermined region of the substrate 1 to define a first active region and a second active region in the first and second device regions DR1 and DR2, respectively.

A first device D1 may be disposed on the first device region DR1 of the substrate 1, and a second device D2 may be disposed on the second device region DR2 of the substrate 1. The first and second devices D1 and D2 may be elements arranged two-dimensionally on the substrate 1 to constitute an IC. For example, at least one of the first and second devices D1 and D2 may be one of a transistor, a diode, and a resistor.

When the first and second devices D1 and D2 are MOS transistors, the first device D1 may include first source and drain regions, which are disposed in the first active region of the first device region DR1, and a first gate dielectric layer and a first gate electrode, which are sequentially stacked on a first channel region between the first source and drain regions. Also, the second device D2 may include second source and drain regions, which are formed in the second active region of the second device region DR2, and a second gate dielectric layer and a second gate electrode, which are sequentially stacked on a second channel region between the second source and drain regions. Accordingly, in FIG. 1, reference numeral 10a may refer to one of the first source and drain regions, and reference numeral 10b may refer to one of the second source and drain regions. The source and drain regions may be impurity regions.

The first device D1 may have a first contact region D1C1, and the second device D2 may have a second contact region D2C1. A first interlayer insulating layer 20 may be disposed on the substrate 1 having the first and second devices D1 and D2. The first interlayer insulating layer 20 may be on the device isolation region 5s. For example, the first interlayer insulating layer 20 may be on at least one of the first source and the drain regions (10a) and on the one of the second source and the drain regions (10b). A first connection pattern 25, which is a conductive pattern, may be disposed on the first interlayer insulating layer 20. The first connection pattern 25 may be disposed at a higher level than the first and second devices D1 and D2. It is noted that a "higher level" hereinafter refers to a vertical height, i.e., a direction along a normal to the substrate 1, with respect to the substrate 1.

The first connection pattern 25 may be formed of one of a doped single crystalline semiconductor layer and a doped polycrystalline semiconductor layer. For example, the first connection pattern 25 may be formed of a doped single crystalline silicon layer or a doped polysilicon layer. In another example, the first connection pattern 25 may be formed of one of a metal silicide layer and a metal layer.

A second interlayer insulating layer 30 covering the first connection pattern 25 may be disposed on the first interlayer insulating layer 20. A second connection pattern 37, which may be a conductive pattern, may be disposed on the second interlayer insulating layer 30. The second connection pattern 37 may include a lower layer 35 and an upper layer 36 that may be sequentially stacked. The lower layer 35 may be formed of, e.g., a doped silicon layer, and the upper layer 36 may be formed of, e.g., a metal such as tungsten. The first and second connection patterns 25 and 37 may constitute an upper connection pattern 40.

A third interlayer insulating layer 45 covering the second connection pattern 37 may be disposed on the second interlayer insulating layer 30. A first contact plug 50a may be disposed through the first to third interlayer insulating layers 20, 30, and 45 and may be electrically connected to a predetermined region of the first device D1. Similarly, a second contact plug 50b may be disposed through the first to third interlayer insulating layers 20, 30, and 45 and may be electrically connected to a predetermined region of the second device D2. The predetermined region of the first device D1 electrically connected to the first contact plug 50a may be the first contact region D1C1. Similarly, the predetermined region of the second device D2 electrically connected to the second contact plug 50b may be the second contact region D2C1. Although the first and second contact regions D1C1 and D2C1 of the first and second devices D1 and D2 may be contact regions of impurity regions 10a and 10b of MOS transistors, the first and second contact regions D1C1 and D2C1 may be contact regions of gate electrodes of the MOS transistors.

The upper connection pattern 40 may be interposed between the first and second contact plugs 50a and 50b and may electrically connect the first and second contact plugs 50a and 50b together. More specifically, the upper connection pattern 40 may be interposed between sidewalls, i.e., surfaces along a vertical direction, of the first and second contact plugs 50a and 50b. Each of the first and second contact plugs 50a and 50b may partially cover the upper connection pattern 40, e.g., the first and second contact plugs 50a and 50b may partially cover a top surface, i.e., a surface facing away from the substrate 1, of the second connection pattern 37.

The upper connection pattern 40 may be a single layer including one of the first and second connection patterns 25 and 37. Alternatively, to minimize resistance, the upper connection pattern 40 may be a multiple layer including both the first and second connection patterns 25 and 37. In other words, since the first and second connection patterns 25 and 37 are connected as parallel resistors between the first and second contact plugs 50a and 50b, the resistance of the upper connection pattern 40 may be minimized.

Since the upper connection pattern 40 is disposed at a higher level than the first and second devices D1 and D2, a third device may be further disposed between the first and second device regions DR1 and DR2. Accordingly, a circuit designer may arrange devices constituting a plurality of circuits more flexibly, so that the devices constituting the circuits may be more highly integrated.

A fourth interlayer insulating layer 55 covering the first and second contact plugs 50a and 50b may be disposed on the third interlayer insulating layer 45. A plurality of upper interconnections 60 may be disposed on the fourth interlayer insulating layer 55. Each upper interconnection 60 may be spaced apart from the adjacent upper interconnection 60 by a predetermined distance.

In the present embodiment, since the upper interconnections 60 may be disposed at a higher level than the upper connection pattern 40, it may be unnecessary to consider the planar area of the upper connection pattern 40 on a plane at the same level as the upper interconnections 60. Accordingly, the upper interconnections 60 may be arranged while minimizing reductions in the width of the upper interconnections 60 and an interval therebetween. Therefore, a more highly integrated interconnection structure may be formed without reducing the operating speed of a semiconductor device because there may be no increase in electrical resistance and parasitic capacitance of the interconnection.

Figure 2A:
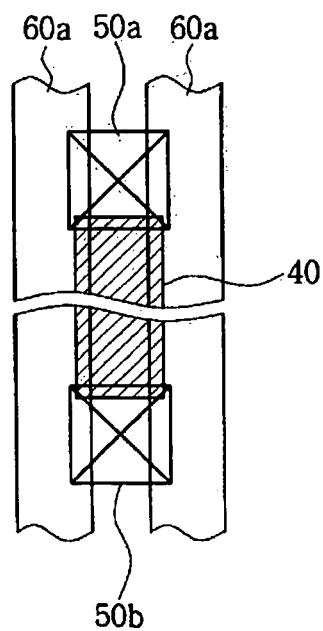
FIG. 2A illustrates a plan view of an electronic device according to an example embodiment.

In another example embodiment, the planar arrangement of the upper interconnections 60 and the upper connection pattern 40 may be provided in detail as illustrated in FIG. 2A.

Figure 2B:
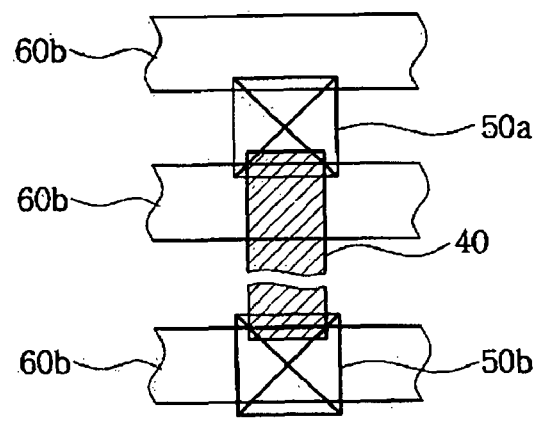
FIG. 2B illustrates a plan view of an electronic device according to another example embodiment.

Referring to FIG. 2A, from the plan view, upper interconnections 60a disposed on the upper connection pattern 40 may be arranged to have the minimum feature size. Also, a lengthwise direction of the upper connection pattern 40 may be parallel to a lengthwise direction of the upper interconnections 60a. Alternatively, as illustrated in FIG. 2B, upper interconnections 60b may be disposed to intersect the upper connection pattern 40.

The present inventive concept may not be limited to the above-described example embodiments and may be embodied in different forms. For example, the first and second devices D1 and D2 may be electrically connected to each other by a local interconnection structure including components according to the above-described example embodiments, e.g., the first and second contact plugs 50a and 50b and the upper connection pattern 40. The first and second devices D1 and D2 may be also embodied to receive electrical signals. An electronic device according to a variation of the above-described example embodiments will be described below with reference to FIG. 3A.

Figure 3A:
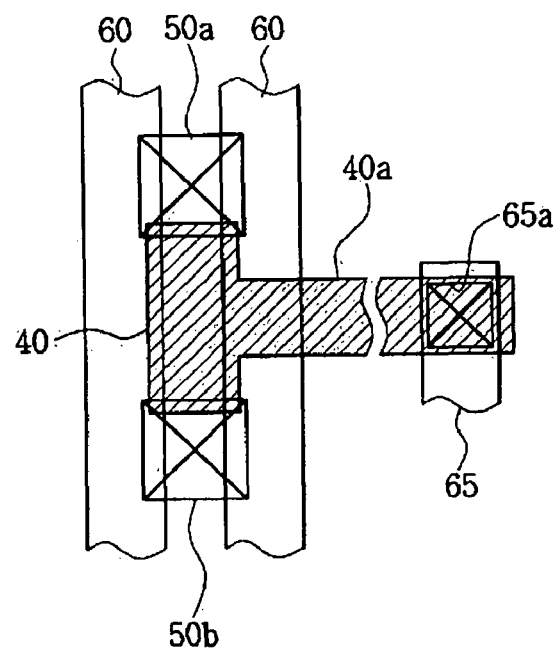
FIG. 3A illustrates a plan view of an electronic device according to still another example embodiment.

Referring to FIG. 3A, in the local interconnection structure described in the above-described example embodiment, a first subsidiary connection pattern 40a, which may be a conductive pattern, may extend from a predetermined region of the upper connection pattern 40 in a horizontal direction. The first subsidiary connection pattern 40a may extend to a region where the upper interconnections 60 are not disposed, i.e., a region that is relatively uncrowded with the upper interconnections 60. Accordingly, a first subsidiary plug 65a and a second upper interconnection 65 covering the first subsidiary plug 65a may be disposed on the first subsidiary connection pattern 40a and may not overlap the upper interconnections 60.

In the present example embodiment, when the upper connection pattern 40 includes a plurality of multiple layers that are vertically arranged, the first subsidiary connection pattern 40a may extend from at least one of the plurality of multiple layers. For example, when the upper connection pattern 40 includes the first and second connection patterns 25 and 37, the first subsidiary connection pattern 40a may be a single layer extending horizontally from one of the first and second connection patterns 25 and 37 or a multiple layer extending horizontally from the first and second connection patterns 25 and 37. Here, when the first subsidiary connection pattern 40a is a multiple layer, the first subsidiary plug 65a may be electrically connected to all layers constituting the first subsidiary connection pattern 40a so that the layers constituting the first subsidiary connection pattern 40a may be connected as parallel resistors.

Figure 3B:
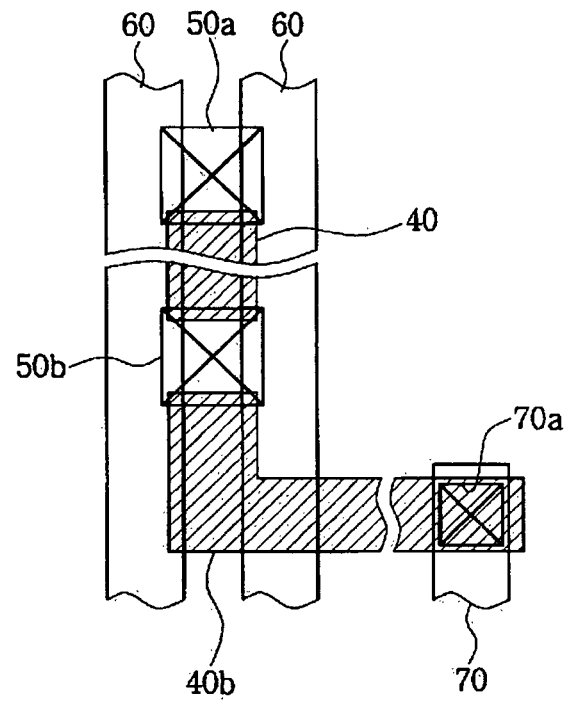
FIG. 3B illustrates a plan view of an electronic device according to yet another example embodiment.

The first subsidiary connection pattern 40a according to the present inventive concept may not be limited to the example embodiment described with reference to FIG. 3A and may be embodied as illustrated in FIG. 3B.

Referring to FIG. 3B, a second subsidiary connection pattern 40b may be further provided. The second subsidiary connection pattern 40b may be disposed at the same level as the upper connection pattern 40 and may be electrically connected to the second contact plug 50b. The second subsidiary connection pattern 40b may extend to a region where the upper interconnections 60 are not disposed, i.e., a region that is relatively uncrowded with the upper interconnections 60. For example, the second subsidiary connection pattern 40b may be at an end portion of the upper connection pattern 40, and may be perpendicular to the upper connection pattern 40. Accordingly, a second subsidiary plug 70a and a third upper interconnection 70 covering the second subsidiary plug 70a may be disposed on the second subsidiary connection pattern 40b and may not overlap the upper interconnections 60.

Figure 4:
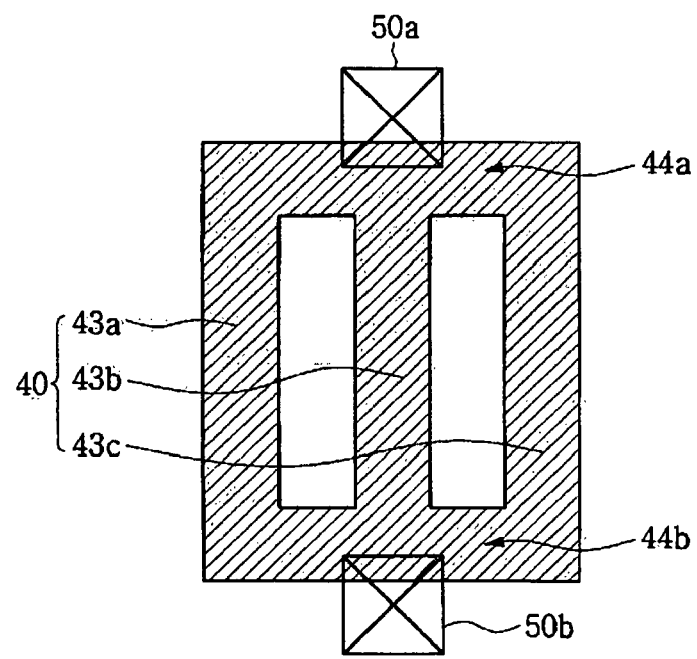
FIG. 4 illustrates a plan view of an electronic device according to yet another example embodiment.

It is described above that the upper interconnection pattern 40 may be a single layer or a multiple layer. At least one layer constituting the upper connection pattern 40 may include a plurality of patterns spaced apart from each other at the same level, as illustrated in FIG. 4. In other words, the upper connection pattern 40 may include a plurality of patterns 43a, 43b, and 43c spaced apart from each other, e.g., at equal intervals, at the same vertical height level. First end portion 44a of the upper connection pattern 40 may connect the plurality of patterns 43a, 43b, and 43c together and may be electrically connected to the first contact plug 50a, while second end portion 44b thereof may connect the plurality of patterns 43a, 43b, and 43c together and may be electrically connected to the second contact plug 50b.

FIG. 1 illustrates the first and second impurity regions 10a and 10b and a connection structure configured to electrically connect the first and second impurity regions 10a and 10b, but the inventive concept is not limited to the example embodiment illustrated in FIG. 1. For example, when the first and second devices D1 and D2 are defined as MOS transistors and gate electrodes of the MOS transistors need to be electrically connected to each other to constitute a circuit, the first and second contact plugs 50a and 50b may be disposed on contact regions of the gate electrodes to be electrically connected.

According to the inventive concept, the upper connection pattern 40 may not only electrically connect the first and second contact regions (refer to D1 C1 and D2C1 in FIG. 1) of the first and second devices D1 and D2 but may also electrically connect a contact region of a third device together with the first and second contact regions D1C1 and D2C1 of the first and second devices D1 and D2. More specifically, the upper connection pattern 40 may cross over the third device, and a third contact plug having the same structure as the first and second contact plugs 50a and 50b may penetrate or separate the upper connection pattern 40 on the contact region of the third device and be electrically connected to the upper connection pattern 40.

An electronic device according to another example embodiment of the inventive concept will be described below with reference to FIG. 5.

Figure 5:
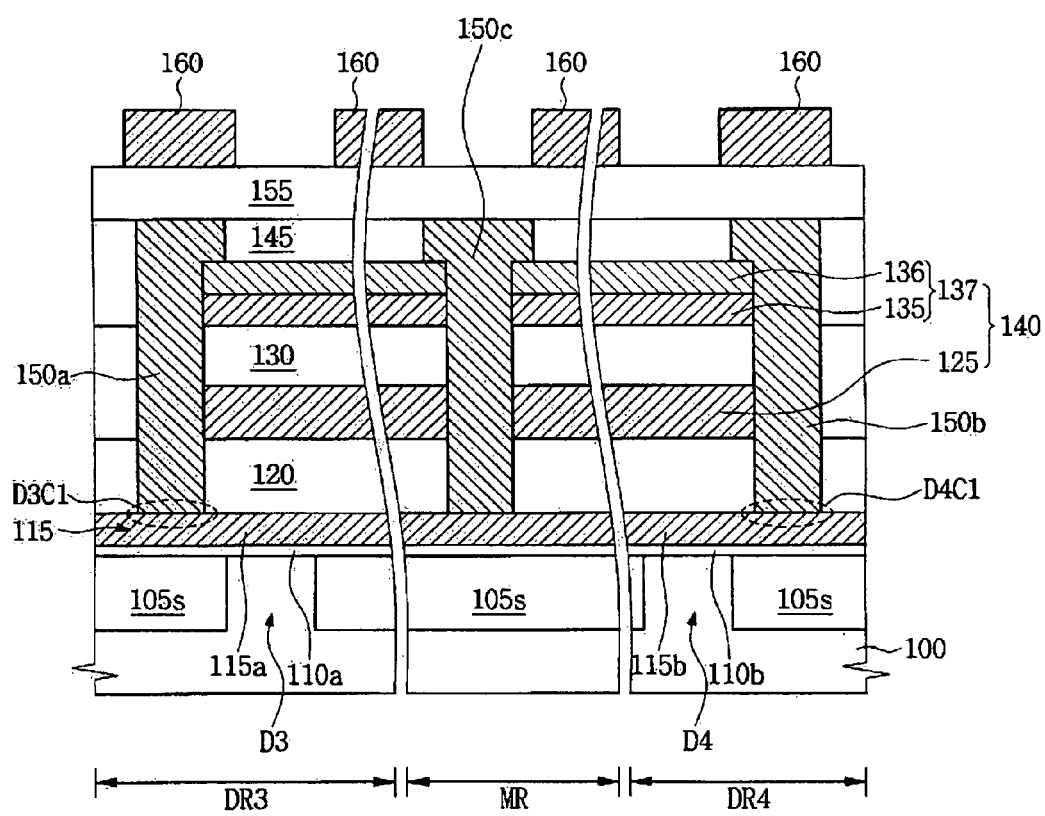
FIG. 5 illustrates a cross-sectional view of an electronic device according to yet another example embodiment.

Referring to FIG. 5, a substrate 100 may include a third device region DR3 and a fourth device region DR4, which constitute a circuit. The substrate 100 may be substantially the same as the substrate 1 described with reference to FIG. 1. A device isolation region 105s may be disposed in a predetermined region of the substrate 100 to define third and fourth active regions in the third and fourth device regions DR3 and DR4, respectively.

A third device D3 may be disposed on the third device region DR3 of the substrate 100, and a fourth device D4 may be disposed on the fourth device region DR4 of the substrate 100. The third and fourth devices D3 and D4 may be elements arranged two-dimensionally on the substrate 100 to constitute a circuit. The third and fourth devices D3 and D4 may be, e.g., MOS transistors.

The present example embodiment will describe that gate electrodes of two devices, i.e., the third and fourth devices D3 and D4, may be electrically connected to constitute a circuit. However, the inventive concept is not limited to the third and fourth devices D3 and D4 embodied as MOS transistors. For example, discrete devices, e.g., bipolar junction transistors (BJTs), diodes, and resistors, which constitute ICs, may also be used as devices according to the inventive concept. In addition, the inventive concept is not limited to electrical connection between gate electrodes of MOS transistors and may include electrical connection between various devices, e.g., electrical connection between impurity regions of MOS transistors and electrical connection between a MOS transistor and a diode.

When the third device D3 is a MOS transistor, it may include third source and drain regions, a third gate electrode 115a, and a gate dielectric layer 110a. The third source and drain regions may be disposed in the third active region of the third device region DR3. The third gate electrode 115a may be disposed on the third active region between the third source and drain regions and may extend onto the device isolation region 105s. The gate dielectric layer 110a may be interposed between the third gate electrode 115a and the third active region. Similarly, when the fourth device D4 is a MOS transistor, it may include fourth source and drain regions, a fourth gate electrode 115b, and a fourth gate dielectric layer 1110b. The fourth source and drain regions may be disposed in the fourth active region of the fourth device region DR4. The fourth gate electrode 115b may be disposed on the fourth active region between the fourth source and drain regions and extend onto the device isolation region 105s. The fourth gate dielectric layer 110b may be interposed between the fourth gate electrode 115b and the fourth active region.

The third device D3 may have a third contact region D3C1, and the fourth device D4 may have a fourth contact region D4C1. The third contact region D3C1 may be defined as a gate contact region of the third gate electrode 115a that the third device D3 includes, and the fourth contact region D4C1 may be defined as a gate contact region of the fourth gate electrode 115b that the fourth device D4 includes.

Fifth through eighth interlayer insulating layers 120, 130, 145, and 155, third and fourth contact plugs 150a and 150b, a second upper connection pattern 140, and upper interconnections 160, which respectively correspond to the first through fourth interlayer insulating layers 20, 30, 45, and 55, the first and second contact plugs 50a and 50b, the first upper connection pattern 40, and the upper interconnections 60 described with reference to FIG. 1, may be disposed on the substrate 100 having the third and fourth devices D3 and D4.

The upper interconnections 160 disposed on the eighth interlayer insulating layer 155 may be disposed in the same manner as the upper interconnections 60a of FIG. 2A or the upper interconnections 60b of FIG. 2B.

The second upper connection pattern 140 may be a single layer or a multiple layer like the first upper connection pattern 40 of FIG. 1. For example, the second upper connection pattern 140 may include third and fourth connection patterns 125 and 137 spaced apart from each other along the vertical direction and positioned between the third and fourth contact plugs 150a and 150b. The sixth interlayer insulation layer 130 may be between the third and fourth connection patterns 125 and 137. Also, the fourth connection pattern 137 may be a stack structure of a doped silicon layer 135 and a metal layer 136. For example, the metal layer 136 may be stacked on, e.g., directly on, the doped silicon layer 135. Components according to the example embodiment may include components similar to those described with reference to FIG. 1. Thus, a detailed description of the same components as those of FIG.

1 will be omitted and only different components from the components of FIG. 1 will be mainly described.

The third gate electrode 115a of the third device D3 may be electrically connected to the fourth gate electrode 115b of the fourth device D4 by a lower connection pattern 115. The lower connection pattern 115 may be a gate line disposed at the same level as the third and fourth gate electrodes 115a and 115b.

The example embodiment of the inventive concept describes that gate electrodes of the MOS transistors may be electrically connected to each other using the lower connection pattern 115 and the upper connection pattern 140, but is not limited thereto. For example, a lower connection pattern may be disposed to electrically connect impurity regions of MOS transistors. In this case, the lower connection pattern may electrically connect impurity regions, which are spaced apart from each other, and be disposed at the same level as at least portions of the MOS transistors. In this case, the impurity regions may be electrically connected to each other not only by the lower connection pattern but also by contact plugs and an upper connection pattern according to example embodiments of the inventive concept.

The third contact plug 150a may be disposed on the third contact region D3C1 of the third gate electrode 115a of the third device D3, while the fourth contact plug 150b may be disposed on the fourth contact region D4C1 of the fourth gate electrode 115b of the fourth device D4. Each of the third and fourth contact plugs 150a and 150b may partially cover the second upper connection pattern 140, e.g., a top surface of the fourth connection pattern 137.

An intermediate contact plug 150c may be spaced apart from the third and fourth contact plugs 150a and 150b. The intermediate contact plug 150c may be between the third and fourth contact plugs 150a and 150b. The intermediate contact plug 150c may penetrate or separate the second upper connection pattern 140 and may be electrically connected to the second upper connection pattern 140. The intermediate contact plug 150c may have a top surface disposed at the same height level as top surfaces of the third and fourth contact plugs 150a and 150b. The intermediate contact plug 150c may partially cover a top surface of the upper connection pattern 140, e.g., a top surface of the fourth connection pattern 137.

According to another example embodiment, the intermediate contact plug 150c may be disposed on an intermediate device region MR between the third and fourth device regions DR3 and DR4. In other words, a fifth device may be further disposed in the intermediate device region MR to constitute a circuit along with the third and fourth devices D3 and D4, and the intermediate contact plug 150c may be disposed in a predetermined region, i.e., a contact region, of the fifth device.

The inventive concept is not limited to the above-described example embodiments and may be embodied in different forms. For example, the inventive concept may be applied to a semiconductor device including a plurality of stacked transistors. A static random access memory (SRAM) according to an example embodiment will be described below as an example of the semiconductor device including the stacked transistors.

Figure 6:
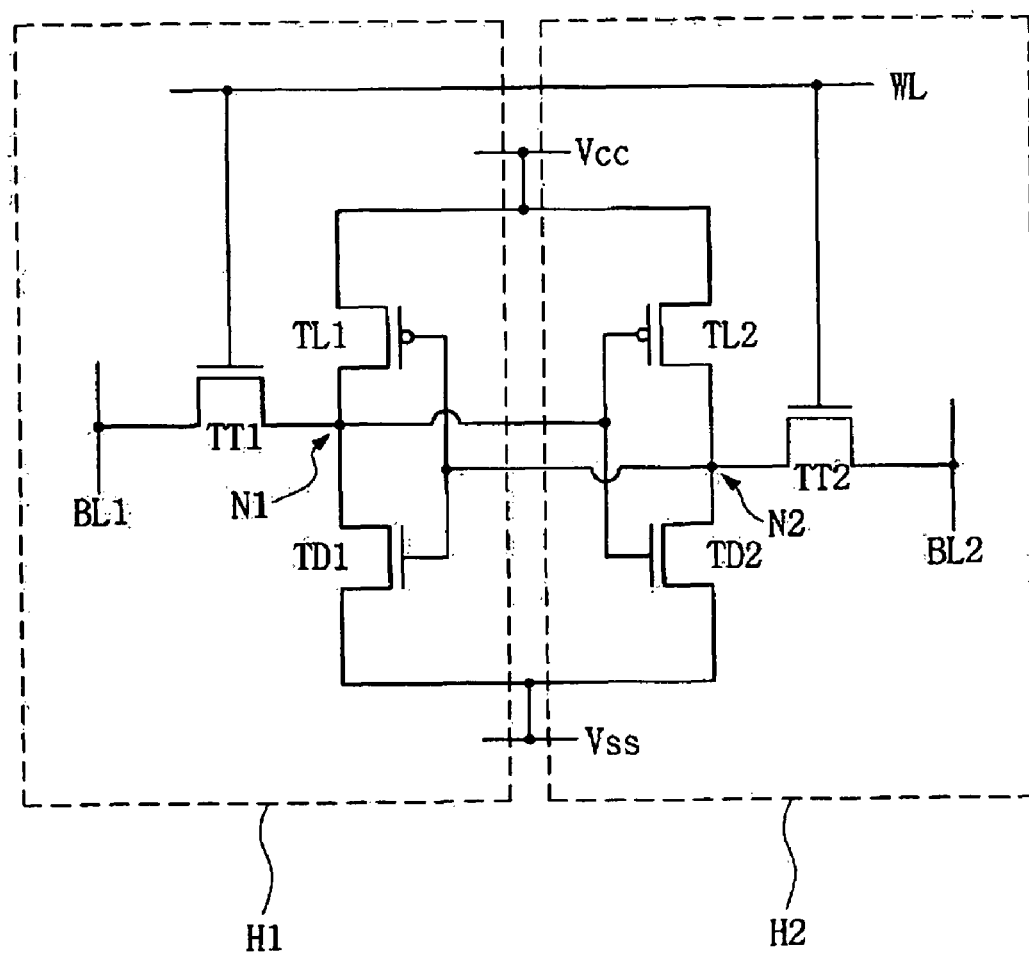
FIG. 6 illustrates an equivalent circuit diagram of a typical complementary metal oxide semiconductor (CMOS) static random access memory (SRAM) cell.
Figure 7A:
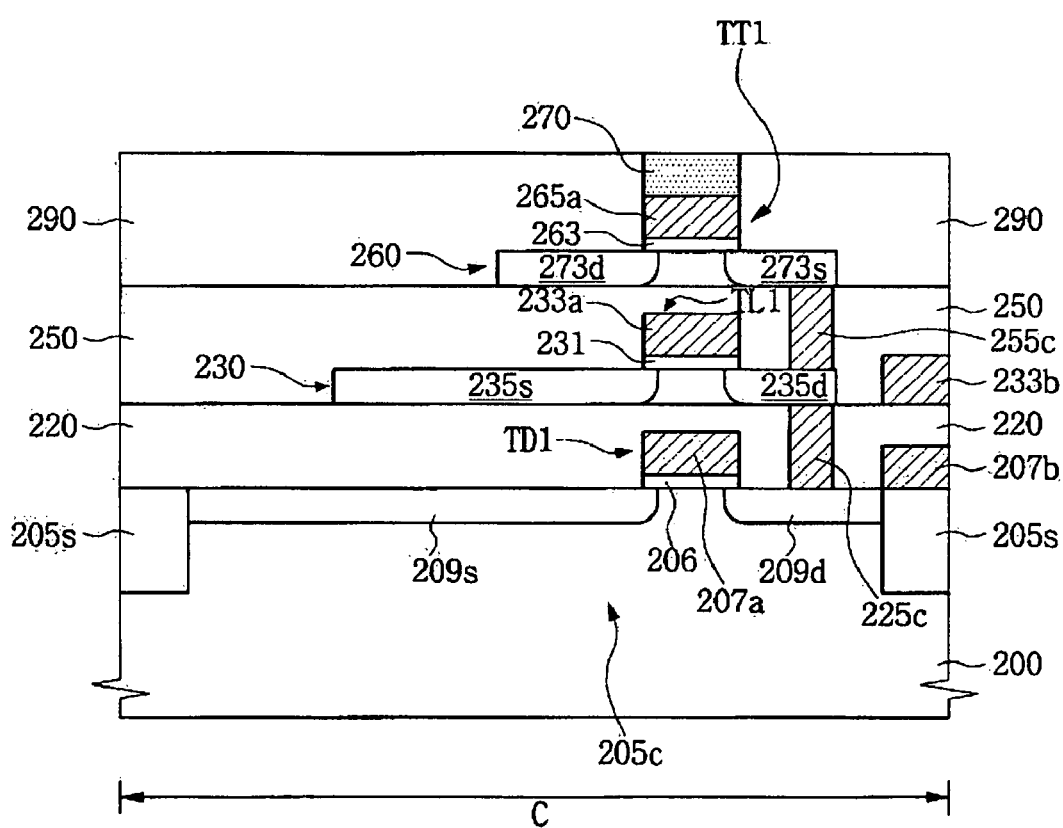
FIGS. 7A, 7B, 8A, and 8B illustrate cross-sectional views of an electronic device according to yet another example embodiment.
Figure 7B:
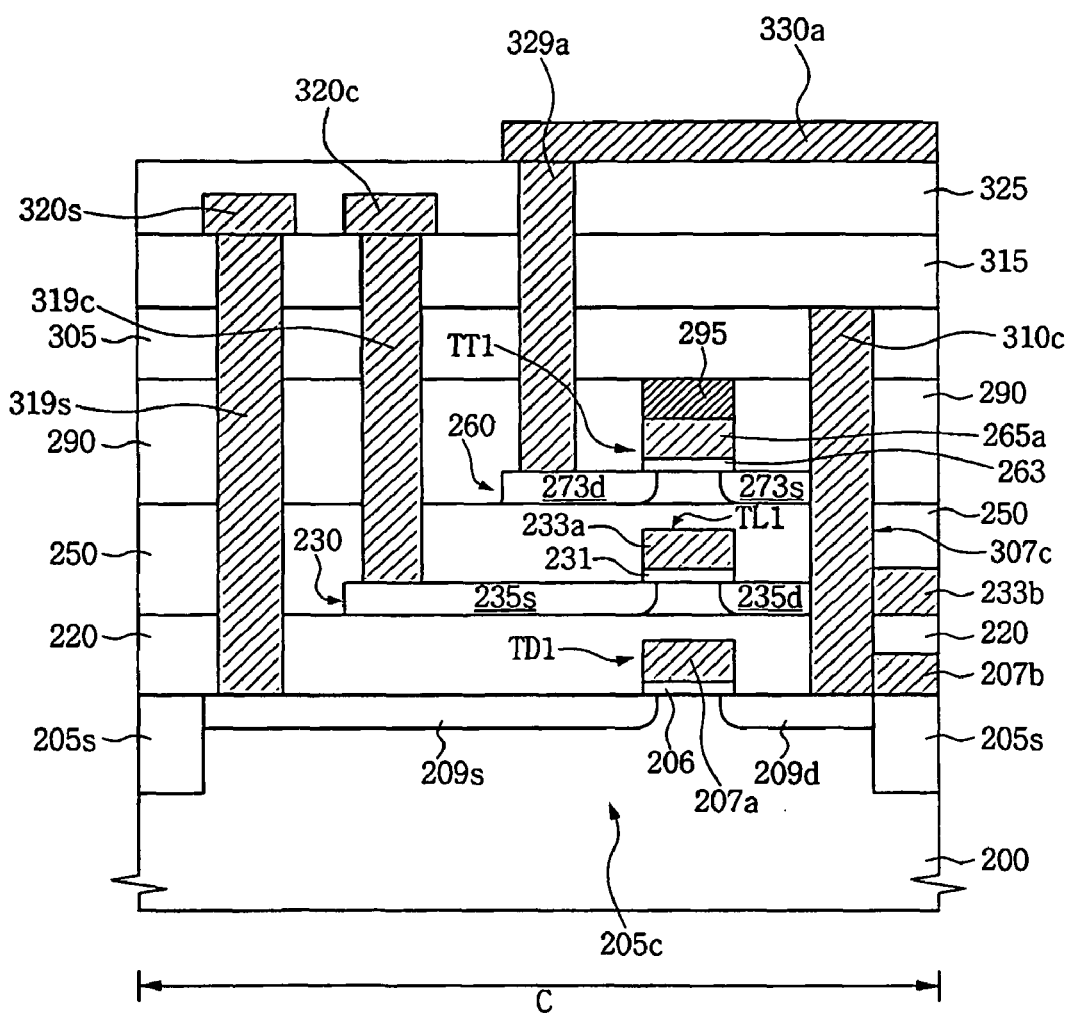
Figure 8A:
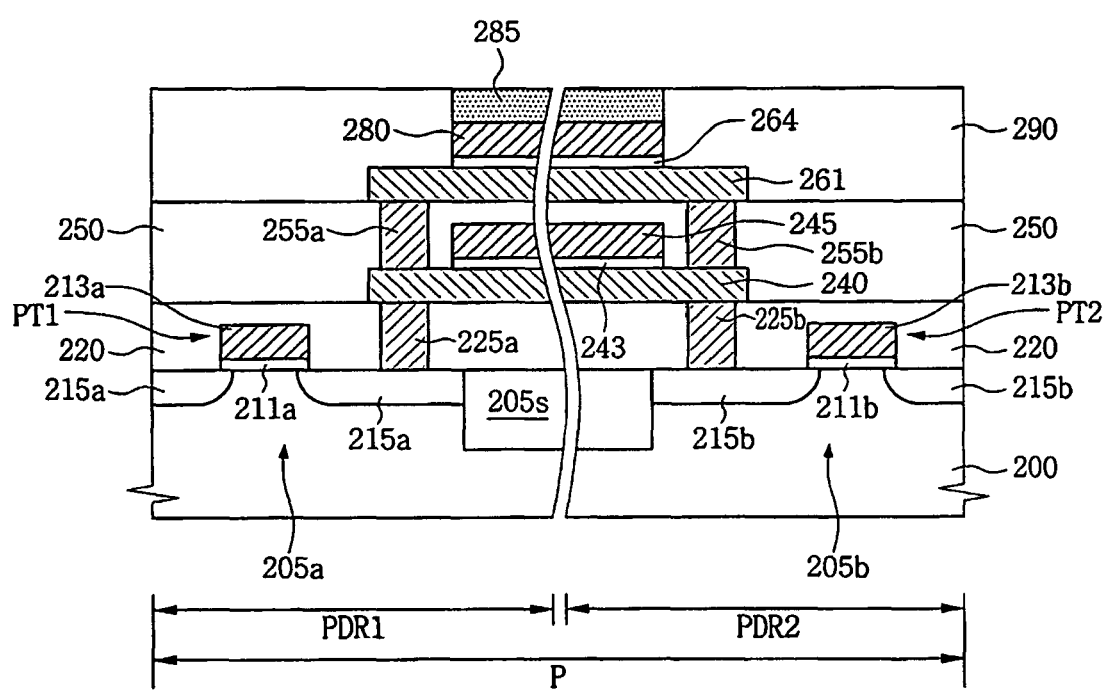
Figure 8B:
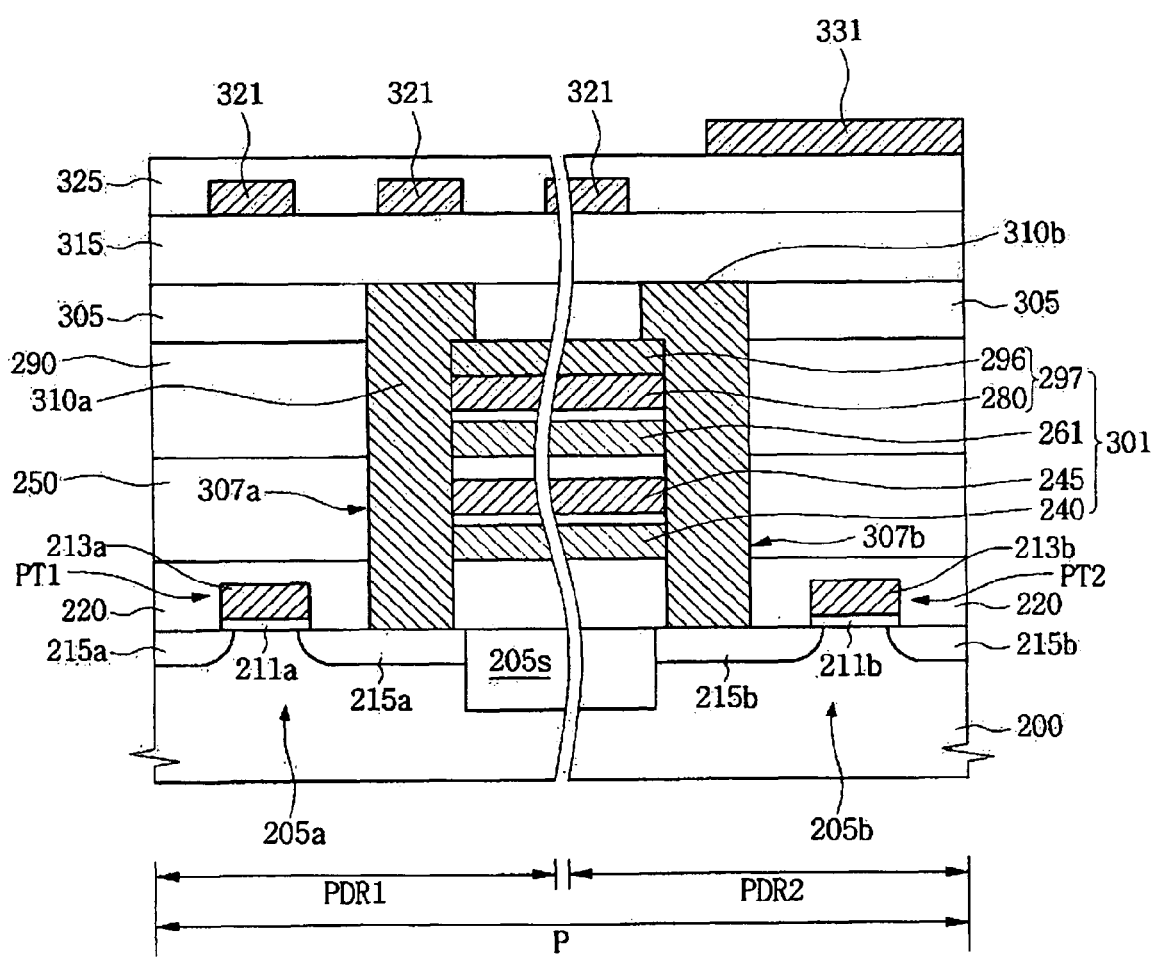

FIG. 6 illustrates an equivalent circuit diagram of a typical complementary metal oxide semiconductor (CMOS) SRAM cell, and FIGS. 7A, 7B, 8A, and 8B illustrate cross-sectional views of an SRAM device according to another example embodiment. Specifically, FIGS. 7A and 7B illustrate cross-sectional views of a portion of a cell region of the SRAM device, and FIGS. 8A and 8B illustrate cross-sectional views of a portion of a peripheral circuit region of the SRAM device.

FIG. 6 illustrates an equivalent circuit diagram of the CMOS SRAM cell to which example embodiments may be applied.

Referring to FIG. 6, the CMOS SRAM cell may include a pair of driver transistors TD1 and TD2, a pair of transfer transistors TT1 and TT2, and a pair of load transistors TL1 and TL2. The driver transistors TD1 and TD2 and the transfer transistors TT1 and TT2 may be NMOS transistors, while the load transistors TL1 and TL2 may be PMOS transistors.

The first driver transistor TD1 and the first transfer transistor TT1 may be connected in series to each other. A source region of the first driver transistor TD1 may be electrically connected to a ground line Vss, while a drain region of the first transfer transistor TT1 may be electrically connected to a first bit line BL1. Similarly, the second driver transistor TD2 and the second transfer transistor TT2 may be connected in series to each other. A source region of the second driver transistor TD2 may be electrically connected to the ground line Vss, while a drain region of the second transfer transistor TT2 may be electrically connected to a second bit line BL2.

Source and drain regions of the first load transistor TL1 may be electrically connected to a power supply line Vcc and a drain region of the first driver transistor TD1, respectively. Similarly, source and drain regions of the second load transistor TL2 may be electrically connected to the power supply line Vcc and a drain region of the second driver transistor TD2, respectively. The drain region of the first load transistor TL1, the drain region of the first driver transistor TD1, and a source region of the first transfer transistor TT1 may correspond to a first node N1. Also, the drain region of the second load transistor TL2, the drain region of the second driver transistor TD2, and the source region of the second transfer transistor TT2 may correspond to a second node N2. A gate electrode of the first driver transistor TD1 and a gate electrode of the first load transistor TL1 may be electrically connected to the second node N2. Also, a gate electrode of the second driver transistor TD2 and a gate electrode of the second load transistor TL2 may be electrically connected to the first node N1. In addition, gate electrodes of the first and second transfer transistors TT1 and TT2 may be electrically connected to a word line WL.

The first driver transistor TD1, the first load transistor TL1, and the first transfer transistor TT1 may constitute a first half cell H1, while the second driver transistor TD2, the second load transistor TL2, and the second transfer transistor TT2 may constitute a second half cell H2.

The above-described CMOS SRAM cell may be widely used for high-performance SRAMs requiring a low power voltage. In particular, when the transfer transistors TT1 and TT2 and the load transistors TL1 and TL2 are stacked on the driver transistors TD1 and TD2, the integration density of an SRAM device may be noticeably increased. In this case, the driver transistors TD1 and TD2 may be bulk transistors disposed on a semiconductor substrate, and the stacked transfer transistors TT1 and TT2 and load transistors TL1 and TL2 may be thin film transistors (TFTs).

When the TFT CMOS SRAM cell includes high-performance P-channel TFTs having electrical characteristics corresponding to P-channel bulk transistors used as load transistors of a bulk CMOS SRAM cell including six bulk transistors formed on a semiconductor substrate, the TFT CMOS SRAM cell may be superior to the bulk CMOS SRAM cell in terms of integration density and latch-up immunity.

In order to embody the high-performance P-channel TFT, the TFT may be formed on a body pattern formed of a single crystalline semiconductor layer. Also, an ohmic contact may be made at the first and second nodes N1 and N2 illustrated in FIG. 6.

A method of fabricating an SRAM device according to another example embodiment will be described below with reference to FIGS. 7A, 7B, 8A, and 8B. FIGS. 7A and 7B illustrate cross-sectional views of a cell region C corresponding to the half cell H1 of FIG. 6, and FIGS. 8A and 8B illustrate cross-sectional views of a first peripheral device region PDR1 and a second peripheral device region PDR2 of a peripheral circuit region P.

Referring to FIGS. 7A and 8A, an isolation layer 205s may be formed in a predetermined region of a semiconductor substrate 200 so that a cell active region 205c may be defined in the cell region C, and first and second peripheral active regions 205a and 205b may be defined in the first and second peripheral device regions PDR1 and PDR2, respectively.

In the cell region C, a bulk transistor using the cell active region 205c as a channel body, i.e., a first driver transistor TD1, may be formed. The first driver transistor TD1 may include a first source region 209s and a first drain region 209d, which are formed in the cell active region 205c, and a first gate insulating layer 206 and a first driver gate electrode 207a, which are stacked on a channel region interposed between the first source and drain regions 209s and 209d. The first source and drain regions 209s and 209d may be N-type impurity regions. That is, the first driver transistor TD1 may be an N-channel MOS transistor. In the cell region C, a portion, i.e., extension, of a second driver gate electrode 207b may be formed on the isolation layer 205s adjacent to the first drain region 209d during the formation of the first driver gate electrode 207a. The second driver gate electrode 207b may correspond to the gate electrode of the second driver transistor TD2 of FIG. 6.

In the peripheral circuit region P, a first peripheral device using the first peripheral active region 205a as a channel body and a second peripheral device using the second peripheral active region 205b as a channel body may be formed during the formation of the first and second driver transistors TD1 and TD2. For example, the first peripheral device may be a first peripheral transistor PT1, and the second peripheral device may be a second peripheral transistor PT2.

The first peripheral transistor PT1 may include first peripheral impurity regions 215a, which are formed in the first peripheral active region 205a, and a first peripheral gate insulating layer 211a and a first peripheral gate electrode 213a, which are stacked on a channel region interposed between the first peripheral impurity regions 215a. The second peripheral transistor PT2 may include second peripheral impurity regions 215b, which are disposed in the second peripheral active region 205b, and a second peripheral gate insulating layer 211b and a second peripheral gate electrode 213b, which are stacked on a channel region interposed between the second peripheral impurity regions 215b.

A first lower insulating layer 220 may be formed on the substrate 200 having the first and second driver transistors TD1 and TD2 and the first and second peripheral transistors PT1 and PT2.

In the cell region C, the first lower insulating layer 220 may be patterned, thereby forming a lower node contact hole exposing the first drain region 209d, and a cell lower node contact plug 225c, i.e., a cell lower semiconductor plug, may be formed in the lower node contact hole. The cell lower node contact plug 225c may be formed by a selective epitaxial growth (SEG) technique using the first drain region 209d as a seed layer. In this case, when the first drain region 209d is formed in the semiconductor substrate 200 formed of a single crystalline semiconductor layer, the lower node contact plug 225c may also be a single crystalline semiconductor plug.

In the peripheral circuit region P, a first peripheral lower semiconductor plug 225a and a second peripheral lower semiconductor plug 225b may be formed using substantially the same process as the cell lower semiconductor plug 225c. The first peripheral lower semiconductor plug 225a may be formed through the lower insulating layer 220 and electrically connected to one of the first peripheral impurity regions 215a. Also, the second peripheral lower semiconductor plug 225b may be electrically connected to one of the second peripheral impurity regions 215b. At least one of the first and second peripheral lower semiconductor plugs 225a and 225b may be omitted.

In the cell region C, a first load transistor TL1 may be formed on the first lower insulating layer 220. For example, the first load transistor TL1 may include a cell lower channel body pattern 230, which is formed on the first lower insulating layer 220, second source and drain regions 235s and 235d, which are formed in the cell lower channel body pattern 230, and a second gate insulating layer 231 and a first load gate electrode 233a, which are stacked on a channel region interposed between the second source and drain regions 235s and 235d. The first load transistor TL1 may be a P-channel TFT. That is, the second source and drain regions 235s and 235d may be P-type impurity regions. In this case, the second drain region 235d may be formed on the cell lower node contact plug 225c. Also, a portion, i.e., extension, of a second load gate electrode 233b may be formed on the first lower insulating layer 220 adjacent to the second drain region 235d during the formation of the first load gate electrode 233a. The second load gate electrode 233b may correspond to the gate electrode of the second load transistor TL2 of FIG. 6.

In the peripheral circuit region P, a first peripheral connection pattern 240, a first inter-pattern insulating layer 243, and a second peripheral connection pattern 245 may be sequentially stacked on the lower insulating layer 220 during the formation of the first and second load transistors TL1 and TL2. Although the first peripheral connection pattern 240 may be disposed at the same level as the cell lower channel body pattern 230, the first peripheral connection pattern 240 may contain impurities at a higher concentration than the cell lower channel body pattern 230 so that it can have a lower resistivity than the cell lower channel body pattern 230. A second lower insulating layer 250 may be formed on the substrate 200 having the first and second load transistors TL1 and TL2, e.g., on the first lower insulating layer 220.

In the cell region C, a cell upper node contact plug 255c, i.e., a cell upper semiconductor plug, may be formed in the second lower insulating layer 250. The cell upper node contact plug 255c may be in contact with the second drain region 235d. Also, the cell upper node contact plug 255c may be formed using the same process as the cell lower node contact plug 225c.

In the peripheral circuit region P, first and second peripheral upper semiconductor plugs 255a and 255b may be formed in the second lower insulating layer 250 using the same process as that used to form the cell upper node contact plug 255c. From the plan view, the first and second peripheral upper semiconductor plugs 255a and 255b may overlap the first and second peripheral lower semiconductor plugs 225a and 225b. Although FIG. 8A illustrates the first and second peripheral upper semiconductor plugs 255a and 255b being connected to the first peripheral connection pattern 240, the inventive concept is not limited thereto. For example, the first and second peripheral upper semiconductor plugs 255a and 255b may be connected to the second peripheral connection pattern 245. In this case, when the second peripheral connection pattern 245 is formed of a polysilicon layer, the first and second peripheral upper semiconductor plugs 255a and 255b may also have polycrystalline structures.

In the cell region C, a cell upper channel body pattern 260, i.e., an upper semiconductor pattern may be formed on the second lower insulating layer 250. The upper channel body pattern 260 may be formed by an epitaxial technique using the cell upper node contact plug 255c as a seed layer. Accordingly, when the cell upper node contact plug 255c is a single crystalline semiconductor plug, the cell upper channel body pattern 260 may also have a single crystalline structure.

In the peripheral circuit region P, a third peripheral connection pattern 261 may be formed at the same level as the cell upper channel body pattern 260. For example, the third peripheral connection pattern 261 may be formed on the second lower insulating layer 250 similar to the cell upper channel body pattern 260. The third peripheral connection pattern 261 may have a single crystalline or polycrystalline structure and be doped with impurities at a higher concentration than the cell upper channel body pattern 260.

A dielectric layer (263 in the cell region C and 264 in the peripheral circuit region P), a conductive layer (not shown), and a capping insulating layer (not shown) may be sequentially formed on the substrate 200 having the cell upper channel body pattern 260 and the third peripheral connection pattern 261.

In the cell region C, the capping insulating layer and the conductive layer may be patterned, thereby forming a first transfer gate electrode 265a and a gate capping pattern 270 crossing over the cell upper channel body pattern 260. The first transfer gate electrode 265a and the gate capping pattern 270 may be formed in the shape of lines. Impurity ions, e.g., N-type impurity ions, may be implanted into the cell upper channel body pattern 260 using the first transfer gate electrode 265a and the gate capping pattern 270 as ion implantation masks, thereby forming a third source region 273s and a third drain region 273d. The third source region 273s may be formed over the cell upper node contact plug 235d. The first transfer gate electrode 265a, the third source region 273s, and the third drain region 273d may constitute the first transfer transistor TT1 of FIG. 6.

In the peripheral circuit region P, the capping insulating layer and the conductive layer may be patterned, thereby forming a fourth peripheral connection pattern 280 and a peripheral capping pattern 285, which are sequentially stacked on the dielectric layer 264 formed on the third peripheral connection pattern 261.

An insulating layer may be formed on the substrate 200 having the gate capping pattern 270 and the peripheral capping pattern 285 and planarized, thereby forming a first intermediate insulating layer 290 exposing top surfaces of the gate capping pattern 270 and the peripheral capping pattern 285.

The gate capping pattern 270 and the peripheral capping pattern 285 may be formed of an insulating layer having an etch selectivity with respect to the first intermediate insulating layer 290. For example, when the first intermediate insulating layer 290 is a silicon oxide layer, the gate capping pattern 270 and the peripheral capping pattern 285 may be formed of a silicon nitride layer or a silicon oxynitride layer.

Referring to FIGS. 7B and 8B, the exposed gate capping pattern 270 and peripheral capping pattern 285 may be removed, thereby forming a line-shaped first groove and a second groove. In this case, the first groove may expose a top surface of the first transfer gate electrode 265a, while the second groove may expose a top surface of the fourth peripheral connection pattern 280. As a result, the first groove may be self-aligned with the first transfer gate electrode 265a, while the second groove may be self-aligned with the fourth peripheral connection pattern 280.

A metal layer, e.g., a tungsten layer, may be formed in the first and second grooves and on the first intermediate insulating layer 290 and planarized, thereby forming a word line 295 and a fifth peripheral connection pattern 296. The word line 295 may be a line-shaped. The word line 295 may be formed in the first groove, while the fifth peripheral connection pattern 296 may be formed in the second groove. The fourth peripheral connection pattern 280 and the fifth peripheral connection pattern 296 may constitute a sixth peripheral connection pattern 297.

The word line 295 formed of the metal layer may have a lower resistivity than a doped polysilicon layer. Accordingly, even if the first transfer gate electrode 265a is formed of a nonmetal conductive material layer, the transmission rate of electrical signals applied to the first transfer gate electrode 265a through the word line 295 formed of the metal layer may be improved.

A second intermediate insulating layer 305 may be formed on the substrate having the word line 295 in the cell region C and on the sixth peripheral connection pattern 296 in the peripheral circuit region P.

In the cell region C, the second intermediate insulating layer 305, the first intermediate insulating layer 290, the second lower insulating layer 250, and the first lower insulating layer 220 may be patterned, thereby forming a first cell node contact hole 307c exposing the third source region 273s, the second drain region 235d, the first drain region 209d, the second load gate electrode 233b, and the second driver gate electrode 207b. During the formation of the first cell node contact hole 307c, the cell upper and lower node contact plugs (refer to 255c and 225c in FIG. 7A) may also be etched.

Similarly, in the peripheral circuit region P, the second intermediate insulating layer 305, the first intermediate insulating layer 290, the second lower insulating layer 250, and the first lower insulating layer 220 may be patterned, thereby forming a first peripheral contact hole 307a and a second peripheral contact hole 307b. The first peripheral contact hole 307a and the second peripheral contact hole 307b may be spaced apart from each other with connection patterns interposed therebetween. In this case, the first peripheral contact hole 307a may expose a contact region of the first peripheral device, e.g., a contact region of one of the first impurity regions 215a of the first peripheral transistor PT1, and the second peripheral contact hole 307b may expose a contact region of one of the second impurity regions 215b of the second peripheral transistor PT2. During the formation of the first and second peripheral contact holes 307a and 307b, the semiconductor plugs (refer to 225a, 225b, 255a, and 255b in FIG. 8A) may be etched.

The fifth connection pattern 296 may be formed of a material having a different etch selectivity from the first through fourth connection patterns 240, 245, 261, and 280. For example, the fifth connection pattern 296 may be formed of a tungsten layer, while the first through fourth connection patterns 240, 245, 261, and 280 may be formed of a heavily doped silicon layer. Accordingly, the first and second peripheral contact holes 307a and 307b may be formed using an etch process capable of etching a silicon layer and a silicon oxide layer rather than the tungsten layer. As a result, during the formation of the first and second peripheral contact holes 307a and 307b, the semiconductor plugs 225a, 225b, 255a, and 255b of FIG. 8A may be etched, and a top surface of the fifth peripheral connection pattern 296 may be partially exposed.

A first cell node contact plug 310c may be formed to fill the first cell node contact hole 307c and simultaneously, first and second peripheral contact plugs 310a and 310b may be formed to fill the first and second peripheral contact holes 307a and 307b, respectively.

According to the inventive concept, the first, second, third, and sixth peripheral connection patterns 240, 245, 261, and 297 formed between the first and second peripheral contact plugs 310a and 310b may be connected as parallel resistors to constitute a peripheral upper connection pattern 301.

A first upper insulating layer 315 may be formed on the second intermediate insulating layer 305 and the contact plugs 310a, 310b, and 310c.

In the cell region C, a ground contact plug 319s may be formed through the first upper insulating layer 315, the second and first intermediate insulating layers 305 and 290, and the second and first lower insulating layers 250 and 220. The ground contact plug 319s may be electrically connected to the first source region 209s. Also, a power supply contact plug 319c may be formed through the first upper insulating layer 315, the second and first intermediate insulating layers 305 and 290, and the second lower insulating layer 250. The power supply contact plug 319c may be electrically connected to the second source region 235s.

In the cell region C, a ground line 320s and a power supply line 320c may be formed on the first upper insulating layer 315 to cover the ground contact plug 319s and the power supply contact plug 319c, respectively. Simultaneously, in the peripheral circuit region P, first upper interconnections 321 may be formed on the first upper insulating layer 315. A plurality of first upper interconnections 321 may be formed.

A second upper insulating layer 325 may be formed on the first upper insulating layer 315 to cover the ground line 320s, the power supply line 320c, and the first upper interconnections 321.

In the cell region C, a bit line contact plug 329a may be formed through the second and first upper insulating layers 325 and 315 and the second and first intermediate insulating layers 305 and 290. The bit line contact plug 329a may be electrically connected to the third drain region 273d. A first bit line 330a may be formed to cover the bit line contact plug 329a. The first bit line 330a may also be extended on the second upper insulating layer 325. Also, in the peripheral circuit region P, second upper interconnections 331 may be formed on the second upper insulating layer 325. The second upper interconnections 331 may not cover the first upper interconnections 321.

The present inventive concept is not limited to the SRAM device formed using the above-described method and may also be applied to various devices, e.g., dynamic random access memory (DRAM) devices, phase-change random access memory (PRAM) devices, and ferroelectric random access memory (FeRAM) devices. More specifically, during formation of a DRAM cell including a cell lower electrode, a data storage material layer, and a cell upper electrode in a cell region of a DRAM device, the cell lower and upper electrodes may be used as upper connection patterns according to the example embodiments of the inventive concept in a peripheral circuit region of the DRAM device.

According to the above-described example embodiments, a more highly integrated interconnection structure may be provided without reducing the sizes of interconnections used for electrically connecting elements of an IC.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An interconnection structure, comprising:
   first and second contact plugs disposed on a semiconductor substrate; and
   a connection pattern interposed between sidewalls of the first and second contact plugs and configured to electrically connect the first and second contact plugs, wherein:
   the connection pattern includes a plurality of patterns spaced apart from each other,
   each of the patterns is electrically connected to the first and second contact plugs,
   the patterns spaced apart from each other are arranged vertically or horizontally, and
   end portions of the patterns are electrically connected to the sidewalls of the first and second contact plugs.

2. The structure as claimed in claim 1, further comprising an intermediate contact plug disposed between the first and second contact plugs to penetrate or separate the connection pattern between the first and second contact plugs, the intermediate contact plug being electrically connected to the connection pattern.

3. An electronic device, comprising:
   first and second elements disposed on a first circuit region of a substrate;
   a first contact plug electrically connected to the first element;
   a second contact plug electrically connected to the second element; and
   an upper connection pattern interposed between sidewalls of the first and second contact plugs and configured to electrically connect the first and second contact plugs, wherein:
   the upper connection pattern includes a plurality of connection patterns spaced apart from each other, and
   each of the connection patterns is electrically connected to the first and second contact plugs.

4. The device as claimed in claim 3, wherein the upper connection pattern is disposed at a higher level than at least one of the first and second elements.

5. The device as claimed in claim 3, wherein the plurality of the connection patterns includes at least one layer of a heavily doped silicon and at least one layer of tungsten metal.

6. The device as claimed in claim 3, wherein at least two of the connection patterns are disposed at different levels.

7. The device as claimed in claim 3, wherein at least two of the connection patterns are disposed at the same level.

8. The device as claimed in claim 3, further comprising a lower connection pattern disposed at a lower level than the upper connection pattern and having a portion disposed at the same level as a portion of at least one of the first and second elements.

9. The device as claimed in claim 3, wherein the first and second contact plugs partially cover a top surface of the upper connection pattern.

10. The device as claimed in claim 3, further comprising:
    a second circuit region of the substrate; and
    a plurality of elements stacked on the second circuit region of the substrate.

11. The device as claimed in claim 10, wherein the plurality of elements stacked on the second circuit region of the substrate includes:

a bulk transistor disposed on the second circuit region of the substrate;

a lower thin film transistor (TFT) disposed at a higher level than the bulk transistor; and an upper TFT disposed at a higher level than the lower TFT.

12. The device as claimed in claim 11, wherein the lower TFT includes:

a lower body pattern disposed at a higher level than the bulk transistor;

a lower source region and a lower drain region disposed in the lower body pattern; and a lower gate electrode disposed on the lower body pattern between the lower source and drain regions, and wherein the upper TFT includes:

an upper body pattern disposed at a higher level than the lower TFT;

an upper source region and an upper drain region disposed in the upper body pattern; and an upper gate electrode disposed on the upper body pattern between the upper source and drain regions.

13. The device as claimed in claim 12, wherein the upper connection pattern is a single layer disposed at the same level as one of the lower body pattern, the lower gate electrode, the upper body pattern, and the upper gate electrode or multiple layers spaced apart from each other and disposed at the same level as at least two of the lower body pattern, the lower gate electrode, the upper body pattern, and the upper gate electrode.

14. The device as claimed in claim 10, wherein the first circuit region is a peripheral circuit region of a semiconductor memory device, and the second circuit region is a cell array region of the semiconductor memory device.

15. The device as claimed in claim 3, further comprising first upper interconnections disposed at a higher level than the first and second contact plugs on the first circuit region of the substrate and spaced apart from the first and second contact plugs.

16. The device as claimed in claim 3, further comprising:

a subsidiary pattern disposed at the same level as at least a portion of the upper connection pattern and electrically connected to at least one of the upper connection pattern and the first and second contact plugs;

a conductive subsidiary plug disposed on the subsidiary pattern; and a second upper interconnection disposed on the subsidiary plug, wherein the second upper interconnection is spaced apart from the first upper interconnection.

17. The device as claimed in claim 3, further comprising an intermediate contact plug configured to penetrate or separate the upper connection pattern between the first and second contact plugs and electrically connected to the upper connection pattern.

* * * * *